US010955485B2

(12) United States Patent
Kabacik

(10) Patent No.: US 10,955,485 B2
(45) Date of Patent: Mar. 23, 2021

(54) BATTERY SENSOR

(71) Applicant: Oxis Energy Limited, Abingdon (GB)

(72) Inventor: Lukasz Kabacik, Abingdon (GB)

(73) Assignee: Oxis Energy Limited, Abingdon-On-Thames (GB)

( * ) Notice: Subject to any disclaimer, the term of this patent is extended or adjusted under 35 U.S.C. 154(b) by 282 days.

(21) Appl. No.: 15/754,800

(22) PCT Filed: Aug. 24, 2016

(86) PCT No.: PCT/GB2016/052631
§ 371 (c)(1),
(2) Date: Feb. 23, 2018

(87) PCT Pub. No.: WO2017/033013
PCT Pub. Date: Mar. 2, 2017

(65) Prior Publication Data
US 2018/0231616 A1   Aug. 16, 2018

(30) Foreign Application Priority Data

Aug. 25, 2015 (GB) .................................. 1515108.7
Aug. 25, 2015 (IT) ............................ 1020150046241

(51) Int. Cl.
| | | |
|---|---|---|
| G01R 31/392 | (2019.01) | |
| G01R 31/378 | (2019.01) | |
| H01M 4/38 | (2006.01) | |
| H01M 10/48 | (2006.01) | |
| H01M 10/052 | (2010.01) | |
| G01R 31/3842 | (2019.01) | |
| G01R 31/382 | (2019.01) | |
| G01B 7/16 | (2006.01) | |
| H01M 2/30 | (2006.01) | |
| H01M 4/62 | (2006.01) | |
| H01M 10/0525 | (2010.01) | |
| H01M 4/02 | (2006.01) | |

(52) U.S. Cl.
CPC ............ *G01R 31/392* (2019.01); *G01B 7/18* (2013.01); *G01R 31/378* (2019.01); *G01R 31/382* (2019.01); *G01R 31/3842* (2019.01); *H01M 2/30* (2013.01); *H01M 4/382* (2013.01); *H01M 4/621* (2013.01); *H01M 4/625* (2013.01); *H01M 10/052* (2013.01); *H01M 10/0525* (2013.01); *H01M 10/48* (2013.01); *H01M 4/38* (2013.01); *H01M 2004/027* (2013.01)

(58) Field of Classification Search
CPC ...... G01B 7/18; G01R 27/20; G01R 31/3648; G01R 31/378; G01R 31/382; G01R 31/3842; G01R 31/392; H01M 2/30; H01M 4/38; H01M 4/382; H01M 4/621; H01M 4/625; H01M 10/052; H01M 10/0525; H01M 10/48; H01M 2004/027
See application file for complete search history.

(56) References Cited

U.S. PATENT DOCUMENTS

| | | | |
|---|---|---|---|
| 5,567,541 A | 10/1996 | Rouhani | |
| 6,329,789 B1 * | 12/2001 | Gavrilov | ............... H02J 7/0069 320/125 |
| 9,893,387 B2 | 2/2018 | Kabacik | |
| 2006/0028172 A1 | 2/2006 | Vaillancourt et al. | |
| 2009/0315698 A1 | 12/2009 | Berdichevsky et al. | |
| 2010/0310930 A1 * | 12/2010 | Park | ..................... H01M 2/0202 429/185 |
| 2012/0105068 A1 | 5/2012 | Wang et al. | |
| 2012/0143585 A1 | 6/2012 | Barsukov et al. | |
| 2012/0316814 A1 | 12/2012 | Rahaman et al. | |
| 2013/0089765 A1 | 4/2013 | Murayama et al. | |
| 2013/0118267 A1 | 5/2013 | Suzuki | |
| 2013/0295424 A1 | 11/2013 | Knoedgen et al. | |
| 2014/0021923 A1 | 1/2014 | Uchida | |
| 2016/0064780 A1 * | 3/2016 | Jarvis | ................ H01M 10/4257 429/50 |
| 2016/0315350 A1 | 10/2016 | Desilani | |
| 2018/0231616 A1 | 8/2018 | Kabacik | |

FOREIGN PATENT DOCUMENTS

| | | | |
|---|---|---|---|
| CN | 103487717 | | 1/2014 |
| CN | 103580094 | | 2/2014 |
| CN | 104603970 | | 5/2015 |
| JP | 11-064398 | * | 3/1999 |
| JP | H 1164398 | | 3/1999 |
| JP | 2006012761 | | 1/2006 |
| JP | 2007066612 | | 3/2007 |
| JP | 2013104796 | | 3/2007 |
| JP | 2009017752 | | 1/2009 |
| JP | 2010032349 | | 2/2012 |
| JP | 2012026771 A | | 2/2012 |
| JP | 2012190600 | | 10/2012 |
| JP | 2012243556 | | 12/2012 |
| JP | 2014068434 | | 4/2014 |

(Continued)

OTHER PUBLICATIONS

Machine translation of JP 11-064398, published on Mar. 5, 1999 (Year: 1999).*

*Primary Examiner* — Anca Eoff
(74) *Attorney, Agent, or Firm* — Mintz Levin Cohn Ferris Glovsky and Popeo, P.C.

(57) ABSTRACT

There is provided a battery comprising an electrochemical unit comprising at least one electrochemical cell. The at least one electrochemical cell comprises a cell anode, a cell cathode and an electrolyte in contact with said cell anode and cell cathode. The electrochemical unit further comprises a first contact electrode mounted on a surface of the electrochemical unit. The battery further comprises a second contact electrode positioned adjacent to the electrochemical unit, whereby the first and second contact electrodes face each other to allow a contact resistance between the first contact electrode and second contact electrode to be measured.

19 Claims, 8 Drawing Sheets

(56) References Cited

FOREIGN PATENT DOCUMENTS

| WO | WO 2014035969 | 8/2013 |
| WO | WO-2013184132 A1 | 12/2013 |
| WO | WO-2014155070 | 2/2014 |
| WO | WO-2015068871 A1 | 5/2015 |
| WO | WO-2015092384 | 6/2015 |
| WO | WO-2015147977 A1 | 10/2015 |

\* cited by examiner

BATTERY SENSOR

This application is a national-phase entry of Patent Cooperation Treaty Application No. PCT/GB2016/052631, entitled "BATTERY SENSOR," which has an international filing date of Aug. 24, 2016, which claims priority benefit to Italian Patent Application No. Application 102015000046241 filed on Aug. 25, 2015, and Great Britain Patent Application No. 1515108.7 filed on Aug. 25, 2015, the contents of which is hereby incorporated by reference in their entirety.

This invention relates to a method and apparatus for determining the State of Charge (SOC) and/or State of Health (SOH) in a battery, in particular in a lithium-sulphur (Li—S) battery.

BACKGROUND

State of Charge (SOC)/State of Health (SOH) estimation is a fundamental for correct battery use and for ensuring safety use of batteries during their life time. There are many approaches to monitor these parameters including battery voltage measurement and impedance spectroscopy, Coulomb counting method, various adaptive systems introduction or combination of those methods.

U.S. Pat. No. 5,567,541A relates to methods and apparatus for measuring the state of charge in a battery based on volume of battery components. In particular, U.S. Pat. No. 5,567,541A discloses using strain-gauges for determining changes in the length of the outside circumference of a battery.

BRIEF SUMMARY OF THE DISCLOSURE

In accordance with an aspect of an embodiment of the present invention there is provided a battery comprising an electrochemical unit comprising at least one electrochemical cell. The at least one electrochemical cell comprises a cell anode, a cell cathode and an electrolyte in contact with said cell anode and cell cathode. The electrochemical unit further comprises a first contact electrode mounted on a surface of the electrochemical unit. The battery further comprises a second contact electrode positioned adjacent to the electrochemical unit, whereby the first and second contact electrodes face each other to allow a contact resistance between the first contact electrode and second contact electrode to be measured.

Thus, a contact resistance can be measured between a first and second contact electrodes which is indicative of the contraction or expansion of the electrochemical cell during charging or discharging of the battery. In this way, a state of charge and/or state of health of the battery may be determined.

The first and second contact electrodes may be electrically isolated from the electrolyte. The second contact electrode may be positioned adjacent the first contact electrode. The second contact electrode may be in contact with the first contact electrode.

The first contact electrode may be provided on an outer surface of the electrochemical unit. The first and second contact electrodes may not contact the electrolyte.

It will be understood that the term contact resistance means a resistance between two electrodes by virtue of their physical contact. The contact resistance is the resistance between first and second contact electrodes when they are in contact.

In one example, the first and second contact electrodes may have a surface roughness. As the contact pressure therebetween increases, the first and second contact electrodes are pressed against each other more firmly, resulting in an increase in the surface area in contact. As the surface area in contact increases, the resistance of the first and second contact electrodes as a combined electrical component will decrease in proportion to the pressure applied. This is because the distance between the conducting portions of the first and second contact electrodes decreases. Furthermore, the electrical surface area between the electrodes is greater due to higher number of conducting particles being packed (or in contact) between each other. This contributes to a better electrical path between the contact electrodes so lower sensor resistance.

The electrochemical unit may be provided within a pouch. The pouch may contain at least one electrochemical cell. Thus, the cell anode, the cell cathode and the electrolyte are within the pouch. The first contact electrode may be provided on a surface of the pouch. The first contact electrode may be provided on an outer surface of the pouch. In one embodiment, the second contact electrode may be mounted on a surface of a battery case configured to house one or more electrochemical units.

Alternatively or additionally, the battery may further comprise a second electrochemical unit comprising at least one electrochemical cell that comprises a cell anode, a cell cathode and an electrolyte in contact with said cell anode and cell cathode. The second contact electrode may be mounted on a surface of the second electrochemical unit. The first and second electrochemical units may be positioned adjacent to one another.

The second electrochemical unit may be provided within a second pouch. Thus, the cell anode, the cell cathode and the electrolyte are within the second pouch. The second contact electrode may be provided on a surface of the second pouch. The second contact electrode may be provided on an outer surface of the second pouch. The first and second pouches may be positioned adjacent to one another, whereby the first and second contact electrodes face each other to allow a contact resistance between the first contact electrode and second contact electrode to be measured.

The battery may be a lithium-sulphur battery, wherein the cell anode comprises a lithium anode, and the cell cathode comprises a mixture of an electroactive sulphur material and an electroconductive material. Examples of a lithium sulphur battery is described, for instance, in WO 2014/155070 and WO 2015/092384.

A lithium-sulphur cell comprises a lithium anode formed, for example, from lithium metal or a lithium metal alloy, and a cathode formed from elemental sulphur or other electroactive sulphur material. The sulphur or other electroactive sulphur material is mixed with an electroconductive material, such as carbon, to improve its electrical conductivity. The electroactive sulphur material and an electroconductive material may be ground and then mixed with a solvent and binder to form a slurry. The slurry may be applied to a current collector, for example, a sheet of metal foil (e.g. copper or aluminium) and then dried to remove the solvent. The resulting structure may be calendared to form a composite structure, which is cut into the desired shape to form a cathode. A separator may be placed on the cathode and the lithium anode placed on the separator. Electrolyte is introduced into the cell to wet the cathode and separator.

The electroactive sulphur material may comprise elemental sulphur, sulphur-based organic compounds, sulphur-based inorganic compounds and sulphur-containing polymers. Preferably, elemental sulphur is used.

The solid electroconductive material may be any suitable conductive material. Preferably, this solid electroconductive material may be formed of carbon. Examples include carbon black, carbon fibre, graphene and carbon nanotubes. Other suitable materials include metal (e.g. flakes, filings and powders) and conductive polymers. Preferably, carbon black is employed.

The lithium sulphur cell may comprise an electrolyte comprising a lithium salt and an organic solvent. The electrolyte is present or disposed between the electrodes, allowing charge to be transferred between the anode and cathode. Suitable organic solvents for use in the electrolyte are tetrahydrofurane, 2-methyltetrahydrofurane, dimethylcarbonate, diethylcarbonate, ethylmethylcarbonate, methylpropylcarbonate, methylpropylpropionate, ethylpropylpropionate, methyl acetate, dimethoxyethane, 1, 3-dioxolane, diglyme (2-methoxyethyl ether), tetraglyme, ethylene carbonate, propylene carbonate, butyrolactone, dioxolane, hexamethyl phosphoamide, pyridine, dimethyl sulfoxide, tributyl phosphate, trimethyl phosphate, N, N, N, N-tetraethyl sulfamide, and sulfone and mixtures thereof. Sulfones, for example, sulfolane is preferred. Suitable lithium salts include lithium hexafluorophosphate ($LiPF_6$), lithium hexafluoroarsenate ($LiAsF_6$), lithium perchlorate ($LiClO_4$), lithium trifluoromethanesulfonimide ($LiN(CF_3SO_2)_2$) and lithium trifluoromethanesulphonate ($CF_3SO_3Li$). Such lithium salts provide charge carrying species in the electrolyte, allowing the redox reactions at the electrodes to occur.

When a lithium sulphur cell is discharged, the sulphur or other electroactive sulphur material is reduced to form polysulphide species that dissolve in the electrolyte. The polysulphide species may be further reduced to form insoluble lithium sulphide. During discharge, therefore, the composition of the cathode changes, whereby at least part of the cathode dissolves into the electrolyte as the cell is discharged. This typically results in a change in volume in the overall cell, which can be measured according to the embodiments described herein to provide an indication of the state of charge and/or state of health of the cell. When charged, the reactions occur in reverse, with lithium sulphide being re-oxidised to form sulphur.

Each electrochemical unit may be separated from an adjacent unit by a dividing member on which the contact electrode is mounted. The dividing member may be provided by a wall of the pouch. The pouch may be a sealed case. The dividing member may be a flexible material, for example, a flexible polymeric material. In some embodiments, the dividing member may be aluminium foil with a polymer coating.

The dividing member may comprise a sheet of metal foil. The dividing member may further comprise an insulating layer whereby to insulate one side of the dividing member from another.

The dividing member may comprise an insulating sheet of material.

Each contact electrode may be formed from an electrical conductor deposited on a surface of the dividing member.

The electrical conductor may comprise a conductive material. The conductive material may have a resistance value of greater than 0.5 kOhm. In some embodiments, the conductive material may be a conductive pattern. Where a conductive pattern is employed, it is the contact resistance between two contacting conductive patterns that is measured and not the resistance across or in the plane of each pattern. The conductive pattern may comprise a metal. In one particular embodiment, the conductive pattern may comprise metal flakes and a polymer. In another embodiment, the conductive pattern may be formed of carbon or carbon-containing material.

The electrical conductor may comprise carbon. Suitable examples include carbon black, carbon fibre, graphene and/or carbon nanotubes. Preferably, carbon black is employed.

The contact electrode may be applied as a paste or slurry comprising an electrical conductor, a binder and a solvent, and, optionally, a resistive material (eg plastic material, a ceramic/metal mixture). By adding ceramic to metal in the resistive material, the resistance of the resistive material can be increased. Suitable binders include PEO, PVDF, conductive polymers. Suitable solvents include polar or non polar solvents (for example water).

In one embodiment, the contact electrode is applied as a paste or slurry comprising carbon. Such a carbon-based, paste or slurry coating may comprise 1 to 70 weight % of carbon. In one example, the paste or slurry coating comprises 5 to 50, preferably 10 to 40 weight % of carbon. Once applied, the solvent may substantially evaporate, leaving a coating that may comprise up to 100 weight % of carbon and binder.

The ratio of binder to carbon may be up to 70:30. In some embodiments, the ratio of carbon to binder may be up to 50:50. In a preferred embodiment, the ratio of carbon to binder is up to 40:60. Thus, once the solvent is evaporated from the slurry, the contact electrode may comprise 40 to 70% by weight carbon, for example, 40 to 50 weight % carbon.

The contact electrode may be applied (e.g. as a paste) to a surface of the cell, for example, the dividing member. The contact electrode may be applied such that it covers a substantial portion of the surface of the cell. Thus, the contact resistance may be measured over a substantial area. In one example, the dividing member may take the form of a pouch, whereby each electrochemical unit is enclosed in an insulating pouch or housing. The contact electrode may be applied to an external surface of the pouch or housing. Each pouch or housing may be placed adjacent to one another such that their respective contact electrodes face one another. The pouches or housings may be contained within an external case. An interior surface of the external case may be provided with a contact electrode. A pouch or housing may be disposed such that its contact electrode faces the contact electrode on the external case, so that a contact resistance between the contact electrode on the pouch and contact electrode on the external case may be determined.

The contact electrodes may be provided with contact tabs configured to contact a device for measuring the contact resistance between facing contact electrodes. The battery may additionally comprise such a device.

The battery may comprise more than two electrochemical units.

Each electrochemical unit may comprise a plurality of electrochemical cells.

In accordance with another aspect of an embodiment of the present invention, there is provided a method of estimating a state of charge of the battery. The method comprises receiving a current contact resistance value; comparing the current contact resistance value with at least one previous contact resistance value corresponding to a known state of charge of the battery; and estimating the state of charge of the battery based at least in part on comparing the current contact resistance value with the at least one previous contact resistance value.

Thus, a state of charge of the battery is estimated using a contact resistance value. The contact resistance value may be indicative of a pressure on a surface of the cell.

The method may further comprise estimating a state of health of the battery based at least in part on the current contact resistance value and the estimated state of charge of the battery.

Thus, a state of health of the battery is estimated based on a contact resistance value. The state of health of the battery may be estimated based additionally on a plurality of previous contact resistance values, each at a known state of charge. The previous contact resistance values may be from a further battery. The further battery may be a prototype battery.

In accordance with one aspect of an embodiment of the present invention, there is provided a method of estimating a state of health of the battery. The method comprises receiving a current contact resistance value at a known state of charge; comparing the current contact resistance value with a plurality of previous contact resistance values, each corresponding to a known state of charge of the battery; and estimating the state of health of the battery based at least in part on comparing the current contact resistance value with the plurality of previous contact resistance values.

Thus, the state of health of the battery may be determined using a current contact resistance value and plurality of previous contact resistance values where the state of charge corresponding to each contact resistance values is known.

The method may further comprise comparing the state of health of the battery to an acceptable range and determining that the battery is potentially unsafe if the state of health is outside the acceptable range.

Thus, the safety of the battery may be determined using the state of health estimation method.

In accordance with a further aspect of an embodiment of the present invention, there is provided a battery management system for the battery. The battery management system comprises a controller configured to receive a current contact resistance value; at least one processor; and a memory comprising instructions which, when executed, cause the at least one processor to: compare the current contact resistance value with at least one previous contact resistance value corresponding to a known state of charge of the battery; and estimate a state of charge of the battery based at least in part on comparing the current contact resistance value with the at least one previous contact resistance value.

The memory may further comprise instructions which, when executed, cause the at least one processor to estimate a state of health of the battery based at least in part on the current contact resistance value and the estimated state of charge of the battery.

In accordance with yet another aspect of an embodiment of the present invention, there is provided a method of estimating a state of charge of a cell in a lithium sulphur battery. The method comprises receiving a current state of charge value indicative of the state of charge of the cell; comparing a first derivative of the state of charge value with a first derivative of at least one previous state of charge value indicative of a known state of charge of the battery; and estimating a state of charge of the battery based at least in part on comparing the first derivative of the current state of charge value with the first derivative of the at least one previous state of charge value.

The state of charge value may be indicative of the extent of expansion or contraction of the cell.

The state of charge values may be pressure sensor values. The pressure sensor values may be resistance values. The resistance values may be contact resistance values.

BRIEF DESCRIPTION OF THE DRAWINGS

Embodiments of the invention are further described hereinafter with reference to the accompanying drawings, in which.

DETAILED DESCRIPTION

Whilst the present inventions will be described in relation to lithium sulphur batteries, it will be appreciated that they equally apply to all electrochemical cell batteries which undergo expansion or contraction during charging or discharging.

Figure 1:
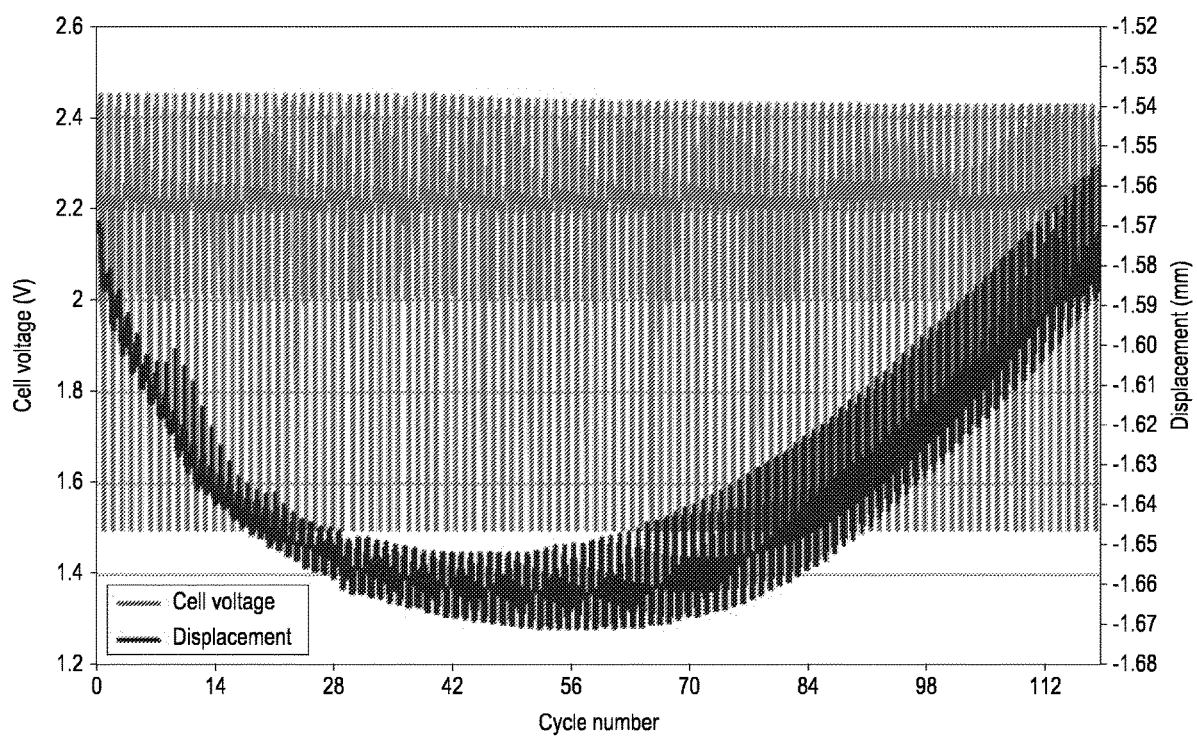
FIG. 1 is an illustration of a graph showing the cell thickness and voltage of a cell during the cycle life of a lithium sulphur battery.

FIG. 1 is an illustration of a graph showing the cell thickness and voltage of a cell during the cycle life of a lithium sulphur battery. The graph shows both the change in cell voltage and the change in displacement of the cell during approximately 120 cycles of charging followed by discharging the cell. In lithium sulphur batteries, it can be seen that the peak cell voltage for each cycle decreases only slightly, by approximately 0.02 volts. Indeed, it is one of the advantages of lithium sulphur batteries that the peak cell voltage does not significantly decrease with repeated charge/discharge cycling. Similarly, the minimum cell voltage for each cycle also remains substantially constant at around 1.5 volts. There is a voltage variation of approximately 0.95 volts between the cell being fully charged and fully discharged.

FIG. 1 also shows the variation in the cell displacement during repeated charging and discharging of the battery. It can be seen that charging and discharging causes variations in the cell displacement as a result of cell expansion and contraction due to the chemical processes occurring at the anode and cathode within the electrochemical cell. Displacement of the cell is connected to the state of charge and health of the cell. In lithium sulphur batteries, the displacement profile during discharge decreases because the cell expands. However, the displacement increases while the cell is charging (cell contracts). Periodic cycles have varying displacements over the cell lifecycle because the repeated charging and discharging eventually causes non-reversible cell expansion due to material degradation and cell age.

In particular, the cell displacement variation shows that there is variation in the amount of expansion and contraction depending on the cycle number. For example, the $57^{th}$ cycle shows a cell displacement which varies between a maximum of approximately −1.65 millimetres and a minimum of approximately −1.67 millimetres, which is a total cell displacement variation of approximately 0.02 millimetres. Comparatively, at the 114$^{th}$ cycle, the cell displacement varies from a maximum of approximately −1.565 millimetres to a minimum of approximately −1.60 millimetres, which is a total cell displacement variation of approximately 0.035 millimetres, almost double the variation seen at the 57$^{th}$ cycle.

In addition to the variation in the displacement range for each cycle, it will also be appreciated that the displacement maximum and minimum for each cycle exhibit independent variation over the lifecycle of the cell. For example, up to approximately the 57$^{th}$ cycle, the minimum displacement value for each cycle decreases with cycle number from approximately −1.575 millimetres at the first cycle to approximately −1.67 millimetres at the 57$^{th}$ cycle. Beyond the 57$^{th}$ cycle, the minimum displacement value increases again, up to approximately −1.59 millimetres. It will be appreciated that if a cell expansion factor can be determined for a battery at a maximum or minimum cell displacement value, or another known reference point, the state of health of the battery can be determined based on previous measurements of the cell expansion factor with a similar battery, which is known to exhibit substantially the same cell expansion lifecycle. In FIG. 1, the cell expansion factor is the cell displacement. This is useful as it enables a calculation to be made of the number of charging cycles remaining for a given battery before the battery reaches the end of its useful life and must be replaced. In some batteries, this may be used even where the battery has not been fully charged and discharged in previous cycles, and so a discharge history of the battery does not match the discharge history of the similar battery used to provide the expected values of the cell expansion factor used to estimate the state of health of the battery.

It will be further appreciated that in some circumstances, the cell expansion factors measured in the battery will be outside the range of cell expansion factors observed in the expected values of the cell expansion factor. This may indicate a faulty battery, which can be replaced for safety or for efficiency.

Figure 2:
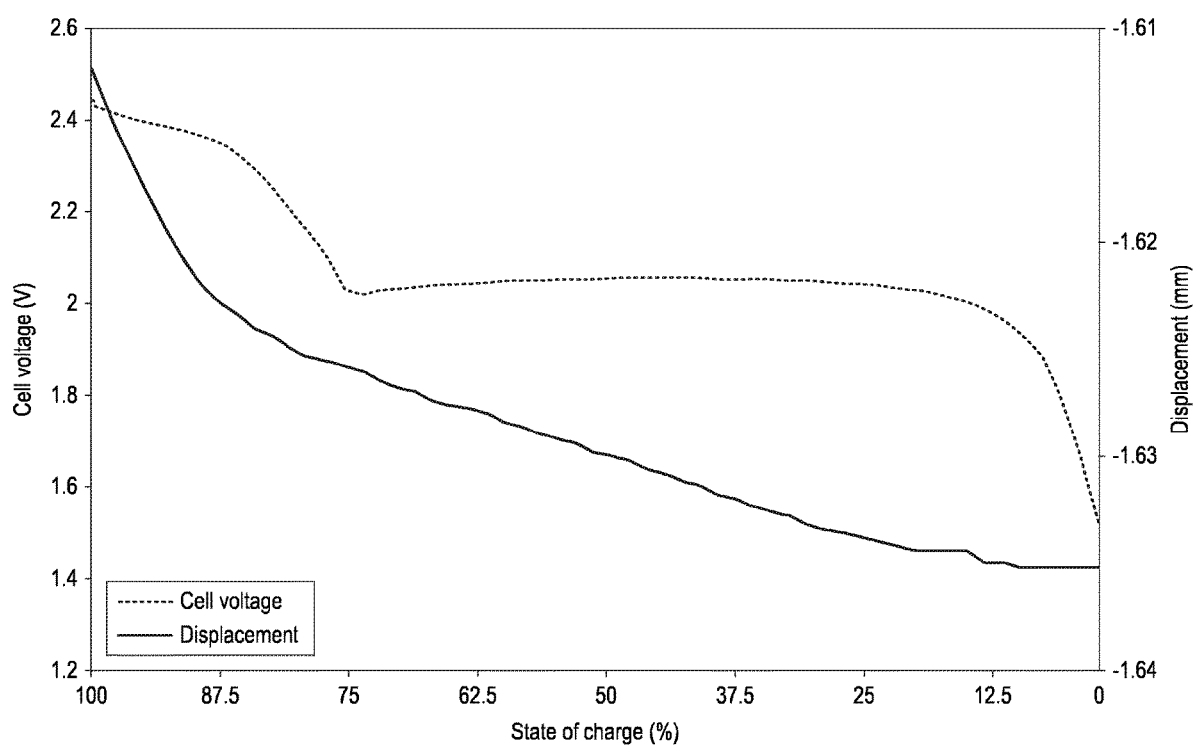
FIG. 2 is an illustration of a graph showing the cell thickness and voltage of a cell during an individual cycle from the cycles shown in FIG. 1.

FIG. 2 is an illustration of a graph showing the cell thickness and voltage of a cell during an individual cycle for a lithium sulphur battery. Whilst the graph of FIG. 1 illustrates data useful for determining the state of health of a battery, the graph of FIG. 2 illustrates data which is useful for determining a state of charge of a battery. It should be noted that FIG. 1 and FIG. 2 represent data from two different batteries. It will be seen that the cell voltage varies in a nonlinear fashion from a maximum initial voltage of approximately 2.45 volts when fully charged to a minimum voltage of approximately 1.50 volts when fully discharged. There is a voltage plateau from around 75% charge (25% discharge) to approximately 25% charge (75% discharge) where the voltage rises slowly from approximately 2 volts at 75% charge to approximately 2.05 volts at approximately 50% charge, before dropping to 2.02 volts at 25% charge. This nonlinear behaviour is also non-deterministic. For example, a cell voltage of approximately 2.05 volts could equate to a battery charge level of approximately 80 percent or less than 50 percent. Therefore, the use of cell voltage to estimate state of charge of a lithium sulphur battery is impractical and unreliable.

The displacement also varies in a nonlinear fashion, from an initial maximum of approximately −1.613 millimetres to a minimum of approximately −1.635 millimetres. However, unlike the cell voltage, the cell expansion factor in the form of a displacement value is substantially deterministic. In other words, there is a 1:1 relationship between a state of charge of the battery and the cell displacement value. A polynomial function may be fitted to the data to provide a model for the state of charge of the battery as a function of the cell displacement value.

However it is not practical to fit a linear variable differential transformer (LVDT) into the battery due to the size and construction limitations. Therefore, alternative solutions are required. A particularly advantageous method for measuring a cell expansion factor is to use thin film pressure sensors. The pressure sensor is positioned on a surface of the cell and against another constrained surface. In this way, when the chemical reactions occurring within the cell cause a change in the chemical composition of the compounds within the cell, a change in pressure within the cell would urge the cell to expand or contract. The cell is substantially prevented from expanding by the constrained surface, thereby creating a change in pressure between the cell surface and the constrained surface. As will be appreciated, the constrained surface may be the battery casing, or may be the cell wall of a further electrochemical cell. Although any contact pressure sensor may be used to measure the contact pressure on the wall of the cell, the presently described embodiment uses a thin film pressure sensor formed from a pair of metal foil electrodes. The sensors are typically less than 1 mm thick and can be installed between the cells without compromising the internal structure of the battery.

Figure 3:
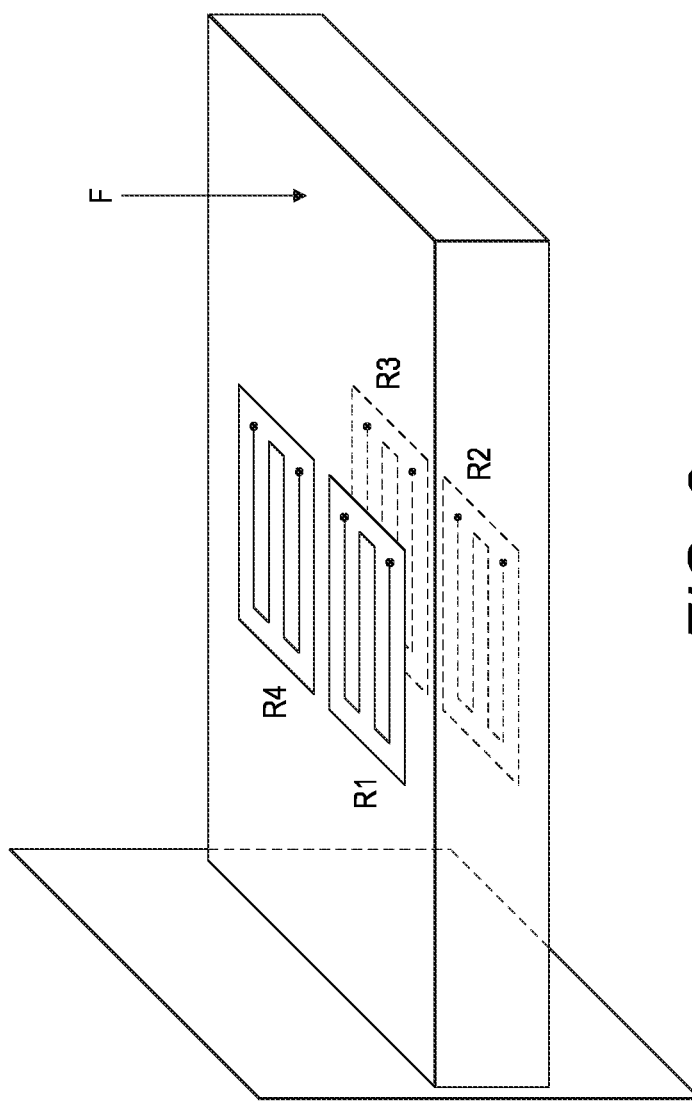
FIG. 3 is an illustration of a diagram of a contact resistance sensor used to measure a contraction or expansion of an electrochemical cell.

FIG. 3 is an illustration of a diagram of a contact resistance sensor used to measure a contraction or expansion of an electrochemical cell. It will be seen that the pressure sensor comprises a conductive pattern, in the form of a resistive pattern, mounted on a first surface and forming a first sensor electrode, overlying a further conductive pattern, in the form of a further resistive pattern, mounted on a second surface forming a second sensor electrode. The contact resistance is the resistance between first and second sensor electrode when they are in contact. The first and second sensor electrodes have a surface roughness. As the contact pressure increases, the first and second sensor electrodes are pressed against each other more firmly, resulting in an increase in the surface area in contact. As the surface area in contact increases, the resistance of the sensor (electrodes couple) will decrease in proportion to the pressure applied. This is because the distance between the conducting portions of the first and second sensor electrodes decreases. Furthermore, the electrical surface area between the electrodes is greater due to higher number of conducting particles being packed (or in contact) between each other. This contributes to a better electrical path between sensor electrodes so lower sensor resistance. In one embodiment, the conductive pattern electrode is formed from a strain gauge. Whilst strain gauges are usually designed to exhibit a change in resistance due to an applied stress in a direction of the orientation of parallel conductor lines forming the strain gauge, in the present embodiment the strain gauges interact in a plane normal to the surface of the strain gauge, to form a pressure sensor sensitive to a change in pressure between the two strain gauges. The strain gauges may comprise a carbon-based ink. It will be appreciated that whilst strain gauges have been described as being used to form the first and second sensor electrodes, any conductive film or pad having a resistance may be used where, due to surface roughness, an increase in pressure normal to the plane of the sensor electrode results in a decrease in the contact resistance. It will also be appreciated that numerous techniques exist for measuring and amplifying the change in resistance. The presently described embodiment uses a Wheatstone bridge with two separate sensor electrodes forming each of the first and second sensor electrodes, each having a known resistance R1, R2, R3, R4.

Although the pressure sensor in the form of the contact resistance sensor may be positioned substantially anywhere on the cell surface between a further constrained surface, the present embodiment positions the contact resistance sensor substantially in the centre of the cell surface. Although the present embodiment has only described a single contact resistance sensor, it will be appreciated that a plurality of contact resistance sensors may be used between a plurality of electrochemical cells within a battery. In some embodiments, a plurality of contact resistance sensors may be positioned in different locations around the surface of the electrochemical cell. In one embodiment, the pressure sensor is formed from a slurry applied to the electrochemical cell. The slurry will be described further with reference to FIG. 6 below.

Figure 4:
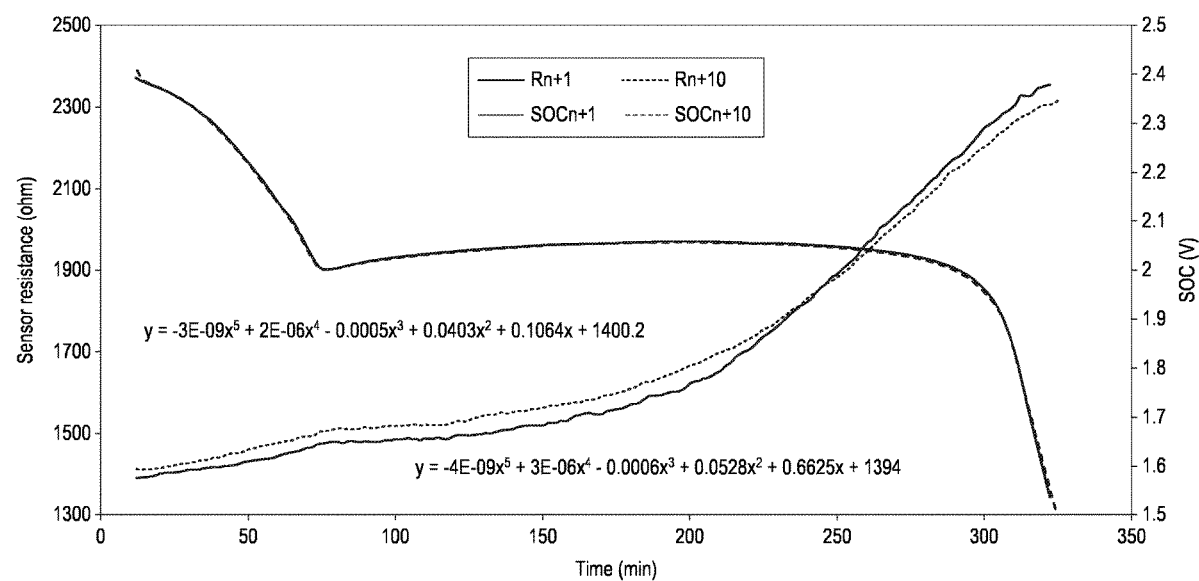
FIG. 4 is an illustration of a graph showing variations in the contact resistance values for a single cell during discharging for two different cycles.

FIG. 4 is an illustration of a graph showing variations in the contact resistance values for a single cell fitted with a contact resistance sensor during discharging for a second and tenth cycle. The graph shows that the cell voltage relationship with discharge remains substantially unchanged between multiple cycles, as expected from FIG. 1. In contrast, the resistance values measured during discharge varies depending on the cycle number. Indeed, the resistance measurements for the tenth cycle appear to indicate a higher resistance than the resistance measurements for the first cycle when the battery is fully charged, and a lower resistance compared to the first cycle when the battery is fully discharged. This is indicative of the cell pressure changes greater in the first cycle compared to the tenth cycle. As discussed previously, this is due to an increase in non-reversibility in the chemical reactions within the cell which lead to cell expansion.

The graph further comprises a polynomial resistance trend line fitted to the resistance measurements for each cycle. The resistance trend line can be expressed as a 5th degree polynomial. It reveals four plateaus (possible more) and four change knees. Those are corresponding to the state of charge (SOC) characteristics where the knees (first priority marks) appear at the beginning of first voltage plateau at around 2.4V, end of first voltage plateau at about 2V, in the highest voltage point of the second plateau at about 2.05V and before the high resistive discharge plateau at about 2V. It is important that all of those readings on a resistance characteristic are not linear and for the same voltage outputs (except first knee) values are about 200 Ohm-600 Ohm difference. The sensitivity of the resistance characteristics can be improved by higher sampling rate which in current case is a sample spacing of 5 minutes.

To determine the change of a slope on the resistance characteristics, the battery management system (BMS) can calculate the resistance first derivative dR/dt. The quality of derivatives and thus changes recognition is determined by the resistance sampling rate.

Figure 5:
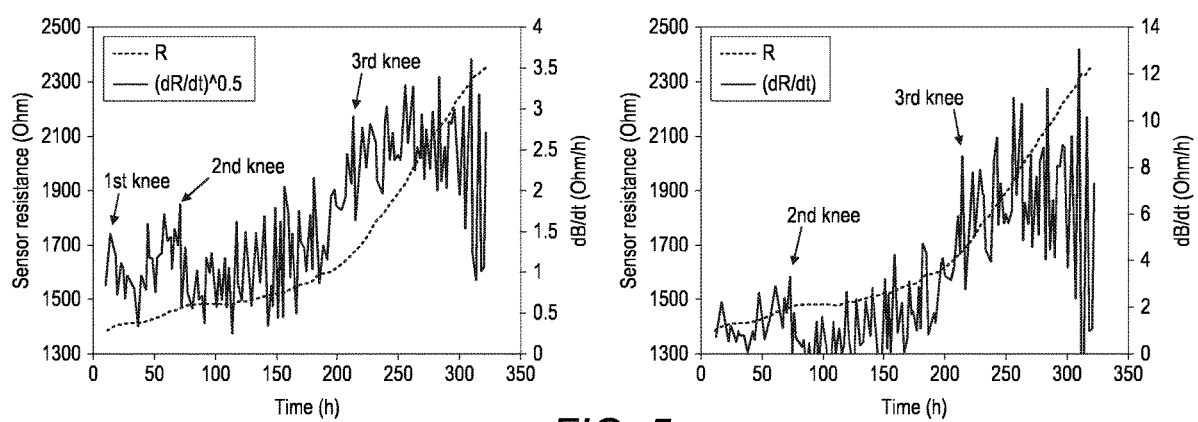
FIG. 5 is an illustration of six graphs showing a plurality of power factors which can be applied to the resistance first derivative.
Figure 5:
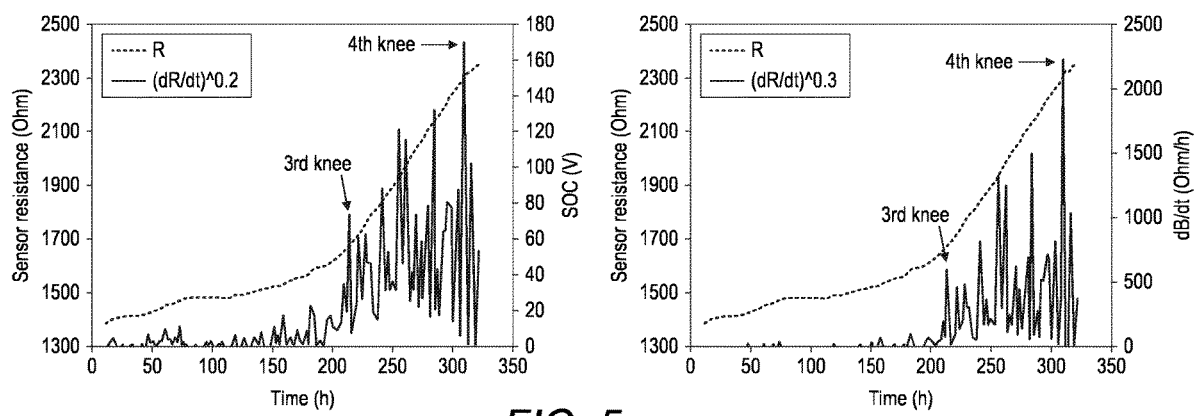
Figure 5:
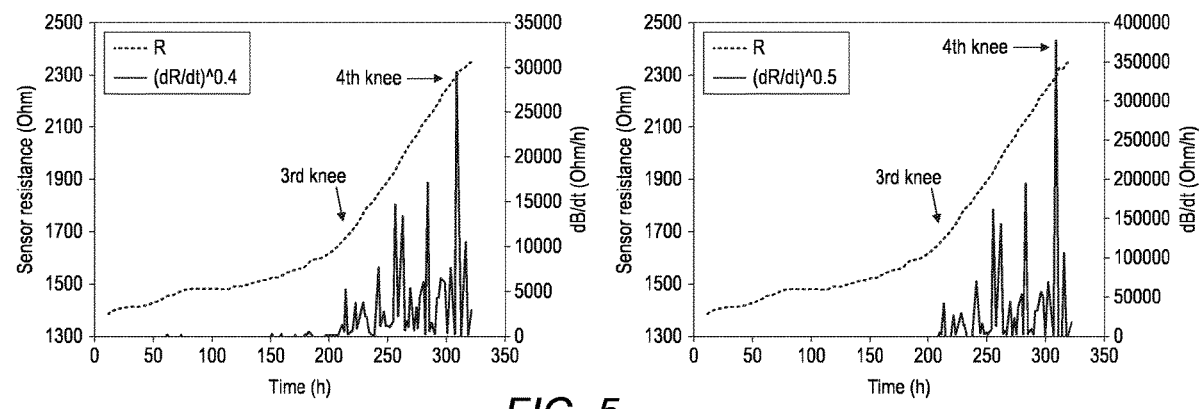

FIG. 5 is an illustration of six graphs showing a plurality of power factors which can be applied to the resistance first derivative. The multiplication process can be performed by the BMS. Raising the dR/dt samples to a power factor can "magnify" the changes of the resistance characteristic and deliver local maximums as discreet values. Those values can be used by the BMS to estimate changes of the resistance characteristics (knees and plateaus) and eventually the SOC of the battery.

Small power factors (n=0.5, 1, 2) are good for the beginning of cell discharge and higher factors for the middle and end of discharge. The BMS can perform manipulation of the first derivative by different power factors simultaneously looking for peaks in results. First "peak" results up to $10^1$ Ohm$^n$/h will suggest second knee on the resistance curve, those of about $10^2$ Ohm$^n$/h third and of about $10^3$ Ohm$^n$/h fourth knee. Together with the discharge voltage measurement the BMS can accurately estimate the SOC of the cell/battery during discharge. The graphs in FIG. 5 have been annotated with labels showing the particular parts of the data that represent the $1^{st}$, $2^{nd}$, $3^{rd}$ and $4^{th}$ knees. As can be seen, the values of dR/dt for the $1^{st}$ and $2^{nd}$ knees are most noticeable in the data when dR/dt is raised to the power of 0.5. The value of dR/dt for the $3^{rd}$ knee is most noticeable in the data when dR/dt is raised to the power of 1. The value of dR/dt for the $4^{th}$ knee is most noticeable in the data when dR/dt is raised to the power of 5, but is also particularly emphasised by powers of 2, 3 and 4.

Although FIG. 5 relates to a first derivative of a resistance measurement, it will be appreciated that a similar technique may be applied to calculate a first derivative of any other cell expansion factor.

Whilst the graphs shown in FIGS. 2 and 4 represent the situation where the battery is actively discharged using a load, it is also important to accurately calculate a state of charge for a battery when the battery has been subject to a rest period with no load connected resulting in self-discharge of the battery. In one embodiment of a lithium sulphur battery used to produce the graphs of FIGS. 2 and 4, the total capacity of the battery was found to be 1.65 Ah. When the battery was subjected to a 50 hour self-discharge rest period prior to full discharge, the remaining capacity was found to be 1.35 Ah. In this particular battery, it was found that the majority of the self-discharge occurred in the first 10-20 hours, at which point the resistance measured by the contact resistance sensor stabilised. The stabilised resistance indicates that the cell is neither expanding nor contracting, which suggests that the self-discharge of the battery is negligible.

Figure 6:
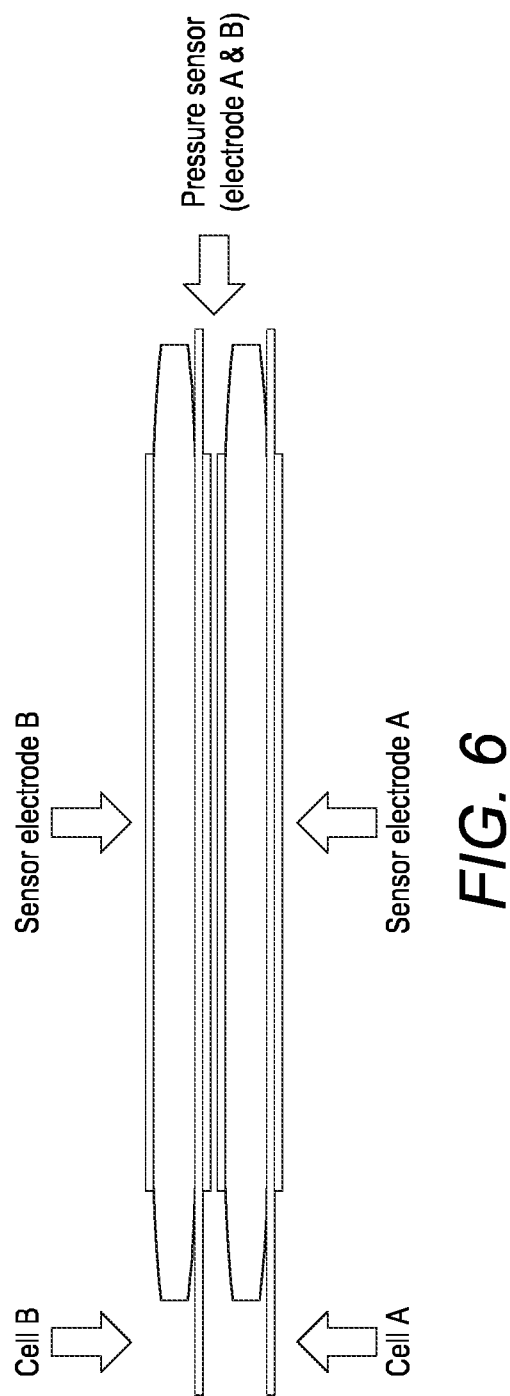
FIG. 6 is an illustration of an assembly of a plurality of cells in accordance with an embodiment of the present invention.

FIG. 6 is an illustration of an assembly of a plurality of cells in accordance with an embodiment of the present invention. A first cell A is provided with a first sensor electrode A on a first side and a second sensor electrode B on a second side opposite the first side. A second cell B is substantially similar to the first cell A, having a first and second sensor electrode A, B. The second cell B is provided adjacent to the first cell A, such that the second sensor electrode B of the first cell A and the first sensor electrode A of the second cell B are provided facing each other to form a pressure sensor in the form of a contact resistance sensor C. The contact resistance sensor C exhibits a reduced resistance as the pressure within either of the first cell A or second cell B increases, increasing the pressure on the contact resistance sensor. Although the presently described embodiment features two cells, it will be appreciated that more cells may be provided, with each cell having a first sensor electrode A and a second sensor electrode B, forming a contact resistance sensor between adjacent cells. In some embodiments, multiple cells may be provided in one or more electrochemical units. Each electrochemical unit is separated from adjacent electrochemical units by a dividing member in the form of a pouch. In this way, the first sensor electrode A may be mounted on a first pouch containing a first electrochemical unit, and the second sensor electrode B may be mounted on a second pouch containing a second electrochemical unit. The dividing member is typically not in contact with an electrolyte of the electrochemical cell.

The first sensor electrode A and second sensor electrode B may be formed by an active cell surface formed during manufacture of the cell. It will be appreciated that an active cell surface is any surface of the electrochemical cell able to act as a sensor for determining a state of charge value, typically in the form of a sensor for determining an expansion or contraction factor. In this way, the sensor is already built into the cell itself rather than being a separate component. In this embodiment, the active cell surface is formed by priming the cell surface area (an external surface of a pouch) with conductive carbon paint and attaching sensor contacts thereto. Over the conductive carbon paint, a sensor electrode formed from a carbon based slurry is applied. Several methods of primer and slurry application are currently known such as: printing, spraying or blade spreading.

In this embodiment, a sulphur cathode slurry was used to create active cell surfaces. In general the slurry blend comprises: a conductor (high surface area carbon eg: carbon black); an insulator (eg: elemental sulphur, polymer etc); a binder (eg: PEO); and a solvent. In one embodiment, the slurry blend comprises 10% carbon black, 70% sulphur and 20% PEO (by weight). It will be appreciated that the slurry blend may have a different blend after application of the slurry blend to the cell surface area. For example, the solvent in the slurry blend may substantially evaporate during application of the slurry blend to the cell surface area.

Thus, the active cell surface should deliver desirable properties and high variable resistance of about 0.5 kOhm to 10 kOhm. It is beneficial for the resistance characteristics of the pressure sensor to have nonlinear resistance variation for linear pressure charge. This is because nonlinear behaviour will feature plateaus and gradient changes which may be identified using the derivative method described previously, and related to the state of charge of the battery.

It will be appreciated that the sensor electrodes are not in contact with the electrolyte of the electrochemical cell. The sensor electrodes are typically provided outside the electrochemical cell.

It will be appreciated that although the present disclosure refers to cell expansion factors, a number of different cell expansion factors may be used which exhibit variation based on a change in pressure or volume within the cell as a result of the chemical reaction at the anode and/or cathode within the electrochemical cell as a result of the charging or discharging process. For example, sensors may be fitted to the cell to measure changes in the length of a side of the cell. Alternatively, sensors may be fitted to the cell to measure changes in the pressure exerted by the cell casing on a battery casing surrounding the cell casing. In this way, the sensor value indicative of a change in pressure within the electrochemical cell may still be termed a cell expansion factor even where the electrochemical cell remains substantially the same volume where the pressure within the electrochemical cell increases. In other words, if the pressure within the electrochemical cell were to be kept constant, the electrochemical cell would have to change volume.

Throughout the description and claims of this specification, the words "comprise" and "contain" and variations of them mean "including but not limited to", and they are not intended to (and do not) exclude other moieties, additives, components, integers or steps. Throughout the description and claims of this specification, the singular encompasses the plural unless the context otherwise requires. In particular, where the indefinite article is used, the specification is to be understood as contemplating plurality as well as singularity, unless the context requires otherwise.

Features, integers, characteristics, compounds, chemical moieties or groups described in conjunction with a particular aspect, embodiment or example of the invention are to be understood to be applicable to any other aspect, embodiment or example described herein unless incompatible therewith. All of the features disclosed in this specification (including any accompanying claims, abstract and drawings), and/or all of the steps of any method or process so disclosed, may be combined in any combination, except combinations where at least some of such features and/or steps are mutually exclusive. The invention is not restricted to the details of any foregoing embodiments. The invention extends to any novel one, or any novel combination, of the features disclosed in this specification (including any accompanying claims, abstract and drawings), or to any novel one, or any novel combination, of the steps of any method or process so disclosed.

The reader's attention is directed to all papers and documents which are filed concurrently with or previous to this specification in connection with this application and which are open to public inspection with this specification, and the contents of all such papers and documents are incorporated herein by reference.

The invention claimed is:

1. A battery comprising:
    an electrochemical unit comprising at least one electrochemical cell and a first contact electrode mounted on a surface of the electrochemical unit, the at least one electrochemical cell comprising a cell anode, a cell cathode, and an electrolyte in contact with the cell anode and the cell cathode;
    a second contact electrode positioned adjacent to the electrochemical unit, the first contact electrode and the second contact electrode being arranged to face each other to allow a contact resistance between the first contact electrode and the second contact electrode to be measured; and
    a device configured to measure the contact resistance between the first contact electrode and the second contact electrode, the measured contact resistance between the first contact electrode and the second contact electrode being indicative of contraction and/or expansion of the electrochemical cell.

2. A battery as claimed in claim 1, wherein the second contact electrode is mounted on a surface of a battery case configured to house the electrochemical unit.

3. A battery as claimed in claim 1, further comprising a second electrochemical unit comprising at least one electrochemical cell that comprises a cell anode, a cell cathode, and an electrolyte in contact with the cell anode and the cell cathode, wherein the second contact electrode is mounted on a surface of the second electrochemical unit.

4. A battery as claimed in claim 1, wherein the cell anode comprises a lithium anode, and wherein the cell cathode comprises a mixture of an electroactive sulphur material and an electroconductive material.

5. A battery as claimed in claim 4, wherein the electrochemical unit is separated from an adjacent electrochemical unit by a dividing member on which the second contact electrode is mounted.

6. A battery as claimed in claim 5, wherein the dividing member comprises a sheet of metal foil.

7. A battery as claimed in claim 6, wherein the dividing member further comprises a sheet of insulating material.

8. A battery as claimed in 7, wherein the second contact electrode is formed from an electrical conductor deposited on a surface of the dividing member.

9. A battery as claimed in claim 8, wherein the electrical conductor comprises a conductive pattern.

10. A battery as claimed in claim 8, wherein the electrical conductor comprises a carbon black material.

11. A battery as claimed in claim 8, wherein the second contact electrode is formed by at least applying, a paste on the surface of the dividing member, the paste comprising a carbon black material and a binder.

12. A battery as claimed in claim 11, wherein the first contact electrode and the second contact electrode are provided with contact tabs configured to contact the device for measuring the contact resistance between the first contact electrode and the second contact electrode.

13. A battery as claimed in claim 12, wherein the battery comprises more than two electrochemical units.

14. A battery as claimed in claim 13, wherein each electrochemical unit comprises a plurality of electrochemical cells.

15. A battery as claimed in claim 1, further comprising a battery management system, the battery management system comprising:
at least one processor; and
a memory comprising instructions which, when executed, cause the at least one processor to at least:
receive a contact resistance value;
compare the contact resistance value with at least one previous contact resistance value, the at least one previous contact resistance value corresponding to at least one known state of charge of the battery; and
estimate a state of charge of the battery based at least in part on comparing the contact resistance value with the at least one previous contact resistance value.

16. A battery as claimed in claim 15, wherein the memory further comprises instructions which, when executed, further cause the at least one processor to at least estimate a state of health of the battery based at least in part on the contact resistance value and the estimated state of charge of the battery.

17. A battery as claimed in claim 1, further comprising:
at least one processor; and
a memory comprising instructions which, when executed, cause the at least one processor to at least:
receive a contact resistance value;
compare the contact resistance value with a plurality of previous contact resistance values, each of the plurality of previous contact resistance values corresponding to a known state of charge of the battery; and
estimate a state of health of the battery based at least in part on the contact resistance value being compared with the plurality of previous contact resistance values.

18. A method comprising:
measuring, by a resistance measurement device, a contact resistance value between a first contact electrode and a second contact electrode, the first contact electrode being mounted on a surface of an electrochemical unit, the electrochemical unit comprising at least one electrochemical cell, the at least one electrochemical cell comprising a cell anode, a cell cathode, and an electrolyte in contact with the cell anode and the cell cathode, the second contact electrode being positioned adjacent to the electrochemical unit, the first contact electrode and the second contact electrode facing each other to allow the contact resistance between the first contact electrode and the second contact electrode to be measured, the measured contact resistance between the first contact electrode and the second contact electrode being indicative of contraction and/or expansion of the electrochemical cell; and
estimating, based on the measured contact resistance value, a state of charge of a battery.

19. The method of claim 18, wherein estimating the state of charge of the battery further comprises:
comparing the measured contact resistance value with at least one previous contact resistance value, the at least one previous contact resistance value corresponding to a known state of charge of the battery; and
estimating, based on the comparing, the state of charge of the battery.

* * * * *